United States Patent [19]

Kierse

[11] Patent Number: 5,796,159

[45] Date of Patent: Aug. 18, 1998

[54] THERMALLY EFFICIENT INTEGRATED CIRCUIT PACKAGE

[75] Inventor: Oliver J. Kierse, Killaloe, Ireland

[73] Assignee: Analog Devices, Inc., Norwood, Mass.

[21] Appl. No.: 854,724

[22] Filed: May 12, 1997

Related U.S. Application Data

[63] Continuation of Ser. No. 565,146, Nov. 30, 1995, abandoned.

[51] Int. Cl.$^6$ .................................................. H01L 23/495
[52] U.S. Cl. ......................... 257/668; 257/675; 257/676; 257/796
[58] Field of Search ........................... 257/668, 675, 257/676, 796

[56] References Cited

U.S. PATENT DOCUMENTS

| | | | |
|---|---|---|---|
| 4,024,570 | 5/1977 | Hartmann et al. | 257/796 |
| 4,862,245 | 8/1989 | Pashby et al. | 257/675 |
| 4,943,843 | 7/1990 | Okinaga et al. | 357/70 |
| 4,951,122 | 8/1990 | Tsubosaki et al. | 257/796 |
| 5,146,310 | 9/1992 | Bayan et al. | 357/70 |
| 5,250,840 | 10/1993 | Oh et al. | 257/676 |
| 5,304,842 | 4/1994 | Farnworth et al. | 257/676 |
| 5,357,139 | 10/1994 | Yaguchi et al. | 257/675 |
| 5,394,298 | 2/1995 | Sagisaka | 257/796 |
| 5,442,233 | 8/1995 | Anjoh et al. | 257/675 |
| 5,444,602 | 8/1995 | Banerjee et al. | 257/675 |
| 5,455,200 | 10/1995 | Bigler et al. | 257/676 |

FOREIGN PATENT DOCUMENTS

| | | | |
|---|---|---|---|
| 2310954 | 12/1990 | Japan . | |
| 382148 | 4/1991 | Japan . | |
| 0198701 | 8/1993 | Japan | 257/796 |

OTHER PUBLICATIONS

"Edquad Cross–Section", ASAT Applications & Services Catalog.

*Primary Examiner*—David Ostrowski
*Attorney, Agent, or Firm*—Koppel & Jacobs

[57] ABSTRACT

A leadframe that exhibits improved thermal dissipation and that can be incorporated in standard integrated circuit (IC) package designs is provided by extending the inner lead portions along a major surface of an IC, and attaching a heat sink on a side of the inner lead portions opposite the IC. The inner lead portions conduct heat from the IC to the heat sink, where it is dissipated into the moulding compound and radiated into the air. In the preferred embodiment, the leads have outer portions that are arranged on only two opposing sides of the IC package and comprise four sets of leads that initially intersect the IC along four lateral sides. This allows for a larger number of leads to contribute to heat dissipation. Added thermal dissipation is achieved by making the inner portion of a ground lead wider than the inner portion of any other lead. In addition, existing IC package designs that utilize the present leadframe structure can accommodate larger ICs than before because the present leadframe structure does not require that the IC be positioned between the tips of the inner lead portions.

20 Claims, 2 Drawing Sheets

THERMALLY EFFICIENT INTEGRATED CIRCUIT PACKAGE

This is a continuation of application Ser. No. 08/565,146, filed on Nov. 30, 1995 now abandoned.

BACKGROUND OF THE INVENTION

1. Field of the Invention

The present invention relates to the housing and protection of integrated circuit chips. More specifically, the present invention relates to a leadframe structure that offers enhanced thermal dissipation for integrated circuit chips.

2. Description of the Related Art

Modern integrated circuits (ICs) require protection from self-heating effects to operate reliably. One of the methods by which ICs are cooled is heat conduction through the leadframe. The leadframe typically consists of a metallic paddle on which the IC is mounted and lead fingers for providing electrically conductive paths from the bonding pads of the IC to external elements, such as circuit boards.

An example of a prior leadframe is illustrated in FIG. 1. The IC 10 is typically attached to a leadframe paddle 12. Electrically conductive lead fingers 14 are electrically connected to the IC 10 with wire bonds 16 and serve to provide electrically conductive paths from the IC 10 to external elements (not shown). The leadframe is typically encapsulated in a moulding compound 18. The external widths of the lead fingers 14 are typically standardized according to the type of package. For example, 8-lead dual in-line plastic (DIP) and 8-lead small outline integrated circuit (SOIC) packages have outer lead finger portions that are between approximately 0.33 and 0.51 mm wide.

The heat conduction paths are along extensions 20 of the leadframe paddle 12 and through the moulding compound 18, which typically has poor thermal conductivity when compared to the lead fingers (which are typically made of copper). Although the lead fingers 14 are generally excellent heat conductors, their contribution to the overall thermal dissipation is relatively low because of the distance between them and the paddle 12, and the resulting thermal gradient across that gap. In addition to the heat dissipation limitations, the size of the IC 10 that this type of leadframe can accommodate is limited by the size of the leadframe paddle 12.

As IC fabrication technology advances, more (and higher power) power generating elements are incorporated into single ICs, creating a need for mounting packages with increased thermal dissipation properties. Some prior packages, such as the EDQUAD packages manufactured by ASAT®, Inc., utilize a heat sink to improve thermal dissipation. In this type of package, the IC is mounted directly on the heat sink with an adhesive, and the inner tips of the lead fingers are placed in thermal contact with the heat sink. As with the leadframe of FIG. 1, this type of package limits the size of the IC that can be accommodated. This is because the IC must be placed in the space between the inner tips of the lead fingers.

One prior leadframe design, described in U.S. Pat. No. 5,146,310 by Bayan et al., improves thermal dissipation by connecting the paddle to four thermally conductive pins and also by increasing the surface area of the leadframe paddle. The paddle pins allow the paddle to be connected to external heat sinks, such as a ground plane on a circuit board. Although the Bayan leadframe design increases thermal dissipation over standard leadframes, the pin count is increased by up to four relative to a standard package. In order to incorporate the Bayan design into standard package designs, such as 8-lead DIP or 8-lead SOIC packages, the package dimensions must be increased by up to 50 percent to accommodate the additional paddle pins. As a result, these packages must be redesigned to accommodate the Bayan leadframe structure.

Another leadframe structure, described in Japanese Pat. Application No. 2-310954 by Isao Sasahara, increases thermal dissipation by placing the inner ends of the lead fingers in close proximity to the leadframe paddle and branching the outer ends of each lead finger, so that a portion of each lead finger is attached to a thermally conductive sheet positioned on top of the IC package. Although the Sasahara structure improves thermal dissipation over standard leadframe structures, additional tooling is required to trim and form the lead fingers after the-leadframe has been encapsulated in the moulding compound, and additional manufacturing steps are required to apply the thermally conductive sheet to the top of the IC package.

A third leadframe structure, described in U.S. Pat. No. 4,943,843 by Okinaga et al., extends some of the lead fingers underneath the IC so that they are better anchored to the moulding compound that typically encapsulates the leadframe and IC. A side benefit of this design is increased thermal dissipation via the lead fingers that extend underneath the IC. However, an even higher level of heat transfer is desirable.

In a fourth leadframe structure, described in Japanese Laid-Open Pat. Application (Kokai) No. 3-82148 by Okada, the lead fingers are extended underneath the IC, and a metal foil is positioned between the lead fingers and the IC. The metal foil helps transfer some of the heat generated by the IC to the lead fingers. However, this structure is designed for packages in which the leads are brought in to the IC from only two sides (typically from the long lateral sides of the package). The leads that are extended underneath the IC initially intersect the IC along its two long lateral sides, and the inner lead portions are bent towards the short lateral sides so that they may be bonded to bonding pads located at the short sides of the IC. Forcing the leads to initially intersect the IC along only two sides limits the total number of leads that may be utilized for heat dissipation. This is because of the space limitation that is encountered as the number of leads is increased.

In addition, the only major heat conduction path provided in the Okada structure is from the IC to the lead fingers via the metal foil. This is because the metal foil is positioned between the lead fingers and the IC.

SUMMARY OF THE INVENTION

In view of the limitations of prior leadframe structures, the present invention provides a leadframe that exhibits improved thermal dissipation and that can be incorporated in standard IC package designs.

This is accomplished by extending the inner lead portions along a major surface of a heat sink, and attaching the IC on a side of the inner lead portions opposite the heat sink. The inner lead portions conduct heat from the IC to the heat sink, where it is dissipated into the moulding compound and radiated into the air directly, or via a further heat dissipating element attached to the heat sink. Some of the heat conducted to the inner lead portions is also conducted to the outside of the package via the leads and into the circuit board upon which the IC package is mounted.

In a preferred embodiment, the leads have outer portions that are arranged on only two opposing sides of the IC package and comprise four sets of leads that initially intersect the IC at four lateral sides, respectively. This allows for a larger number of leads to contribute to heat dissipation. In addition, the inner portion of the ground lead may be made wider than the other inner lead portions. The ground lead is typically connected to a ground plane on the circuit board which can also function as a heat sink. As a result, the ground lead is a more efficient heat dissipator than the other non-grounded leads. The preferred embodiment takes advantage of this by making the surface area of the inner ground lead portion at least twice that of the other inner lead portions so that more heat is conducted into the ground lead.

In contrast to some of the prior thermally enhanced leadframe structures, the present structure utilizes the existing leads of a leadframe to conduct heat away from the IC. Since the number of leads is not increased, the thermally efficient leadframe structure can be incorporated into existing IC package designs without increasing the size of the package. In addition, existing IC package designs that utilize the present leadframe structure can accommodate larger ICs than before because the present structure has no leadframe paddle to limit the IC size, as the IC is placed directly on the leads.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
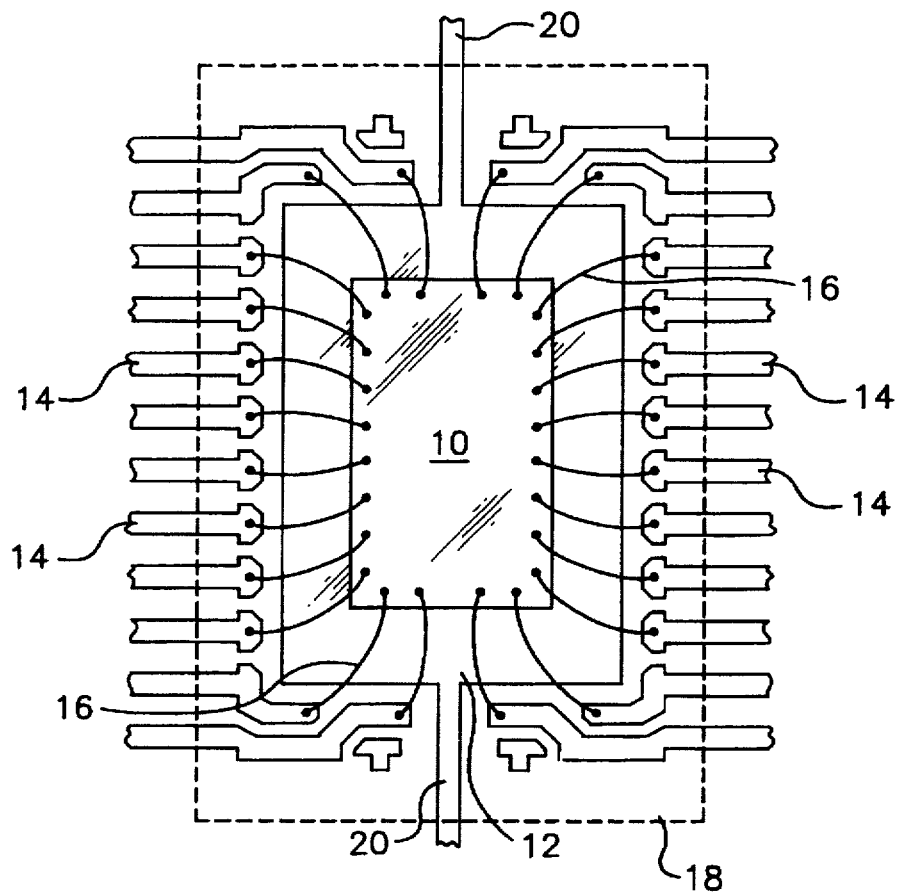
FIG. 1, described above, is a sectional view of an IC package incorporating a prior leadframe structure.
Figure 2:
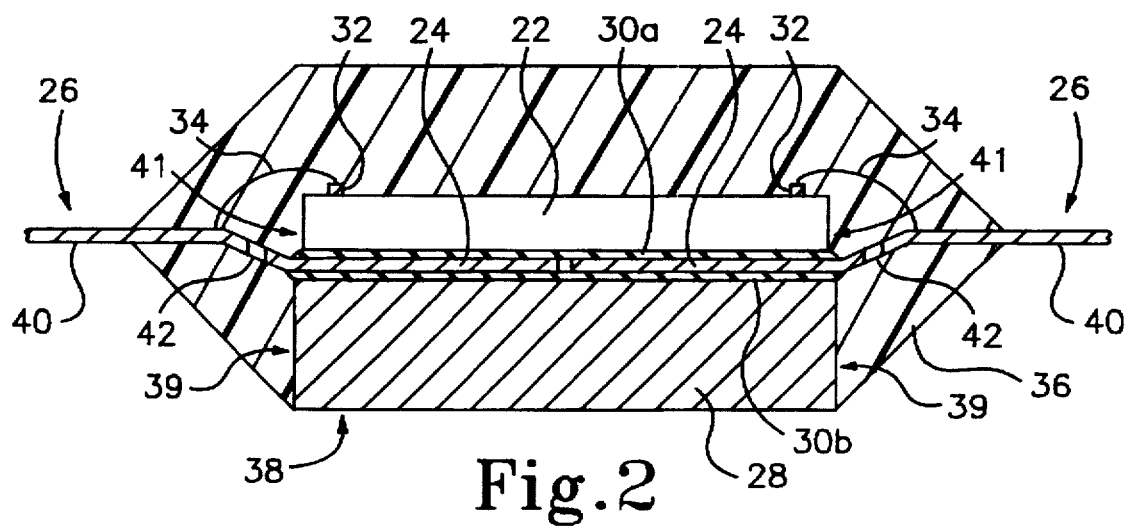
FIG. 2 is a sectional view of an IC package incorporating the thermally enhanced leadframe structure of the present invention.

FIG. 2 illustrates an IC package incorporating the thermally enhanced leadframe structure of the present invention. The IC 22 is supported by the inner portions 24 of leads 26, which are preferably made of electrically and thermally conducting material, such as copper. A heat sink 28 is attached to the side of the inner lead portions 24 opposite the IC 22. The IC 22 and heat sink 28 are preferably attached to the inner lead portions 24 with electrically insulating and thermally conductive adhesive layers 30a and 30b, suitably Alpha Metals Stay Stik™ tape adhesive. The leads 26 are electrically connected to terminals 32 on the IC 22 with wire bonds 34.

The IC 22 and inner lead portions 24 are encapsulated in a moulding compound 36, such as Sumitomo EME 6300H moulding compound. The heat sink 28 is preferably made of plated copper and is preferably only partially encapsulated by the moulding compound 36, so that a major surface 38 is exposed to air. The lateral boundaries 39 of the heat sink 28 preferably extend beyond the lateral boundaries 41 of the IC 22 to increase the amount of heat dissipation.

Figure 3:
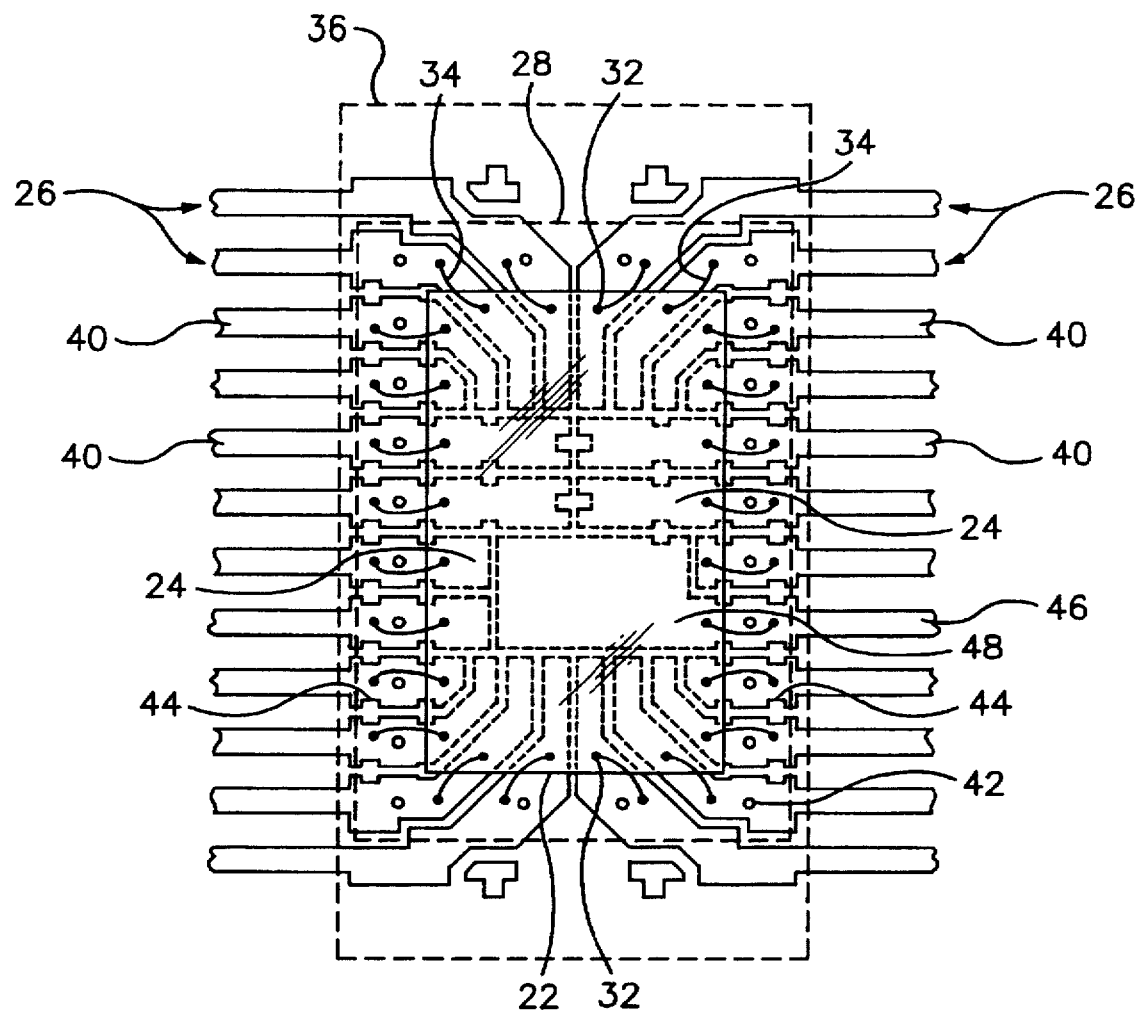
FIG. 3 is a top plan view of the thermally enhanced leadframe structure of FIG. 2.

FIG. 3 is a top plan view of the IC package of FIG. 2, with the heat sink 28 that is positioned on the bottom side of the inner lead portions 24 illustrated as a thick dashed line. The widths of the outer lead portions 40 are typically between approximately 0.33 and 0.51 mm, with an approximate center-to-center spacing of 1.27 mm. These are the standard outer widths and spacings generally used in leadframes.

Prior leadframes that utilize their leads to support the IC typically have uniform width leads. In contrast, some of the inner lead portions 24 of the present leadframe structure may be wider than their respective outer lead portions 40. In such an embodiment, the widths of the wider inner lead portions 24 are between approximately 1.07 and 1.14 mm. The center-to-center spacing of all the inner lead portions 24 is preferably, but not necessarily, the same as that of the outer lead portions 40.

The widths of the inner lead portions 24 are controlled by making the gaps between them as small as the manufacturing process will allow, while maintaining electrical isolation. If the leadframe is manufactured with standard chemical etching techniques, the gap can be generally as small as the leadframe is thick, typically between 0.127 and 0.203 mm. The wider inner lead portions 24 result in a larger thermal contact area between them, the IC 22 and the heat sink 28, which increases the amount of heat conducted away from the IC 22. In the preferred embodiment, at least 80 percent of the IC surface is covered by the inner lead portions 24.

Prior to the encapsulation of the IC 22, the inner lead portions 24 and the heat sink 28 in the moulding compound 36, the leads 26 are held in position with tie bars (not shown). In the preferred embodiment, the inner lead portions 24 contain perforations 42 and indentations 44. During encapsulation, the moulding compound 36 flows through the perforations 42 and into the indentations 44, thereby securely anchoring the leads 26 in the moulding compound 36. After the inner lead portions 24, IC 22 and heat sink 28 have been encapsulated in the moulding compound 36, the tie bars are cut so that the leads 26 are electrically isolated from each other. Since the leads 26 are securely anchored in the moulding compound 36, their relative positions are maintained after the tie bar is cut.

An additional benefit of supporting the IC 22 with the inner lead portions 24 is the ability to accommodate wider ICs than is possible with prior heat sink packages. In prior heat sink packages, the IC is placed directly on the heat sink between the tips of the inner lead portions. The IC width cannot be greater than the space between the tips of the inner lead portions. This space is limited because the IC cannot be in electrical contact with the inner lead portions (there must be a space of approximately 203 to 254 microns between the inner lead portions and the IC). Since the present leadframe does not require that the IC be positioned between the tips of the inner lead portions, this width limitation is not present. As a result, the present leadframe can accommodate ICs that are at least 405 to 508 microns wider than those accommodated by prior heat sink packages.

Still another benefit of the present invention is improved adhesion between the heat sink 28 and the inner lead portions 24. This is due to the relatively large contact area between the heat sink 28 and inner lead portions 24. In prior heat sink packages, only the tips of the inner lead portions are contacted to the heat sink, resulting in relatively poor adhesion.

In operation, heat generated by the IC 22 is transmitted to the inner lead portions 24. The large thermal contact area between the IC 22, the inner lead portions 24 and the heat sink 28 results in an efficient heat transfer from the IC 22 to the heat sink 28, where it is radiated into the air. Heat is also transmitted to the circuit board (not shown) by the leads 26.

Although the present invention utilizes the leads 26 and heat sink 28 as the primary path for heat dissipation, other heat conducting paths are still present. For example, some of the heat is conducted through the moulding compound 36 to the surface of the package, where it is radiated into the air.

In typical IC packages, at least one of the leads 26 is designated a ground lead and is connected to a metal ground plane on the circuit board (not shown). The metal ground plane on the circuit board also serves as an efficient heat sink because of its thermal conduction properties and the relatively large area that it typically occupies on the circuit board. As a result, the ground plane is a more efficient heat conductor than other portions of the circuit board.

In the preferred embodiment, the higher heat conduction properties of the ground plane are utilized by designing the ground lead 46 so that its inner portion 48 extends under a substantially larger area of the IC 22 surface than any other individual inner lead portion 24, preferably an area at least twice as large. The larger inner ground lead portion 48 (which is connected to the ground plane/heat sink on the circuit board (not shown)) results in a larger thermal contact area between it and the IC 22. Thus, the preferred embodiment takes advantage of the more efficient heat conduction path provided by the ground lead/ground plane combination, while still utilizing the other leads 26 in the package for heat conduction.

In the preferred embodiment, the outer portions 40 of leads 26 are arranged on only two opposing sides (left and right in FIG. 3) of the IC package and comprise four sets of leads that initially contact the IC along its four lateral sides (left, right, top and bottom). The leads that extend along the top and bottom sides of the IC undergo bends, with a bend angle that preferably falls within the range of 60 to 90 degrees, at least partially external to the IC chip but still within the encapsulation, to emerge along the left and right hand sides of the package. This allows for a larger number of leads 26 to contribute to heat dissipation.

Numerous other variations and alternate embodiments will occur to those skilled in the art without departing from the spirit and scope of the invention. For example, although specific illustrative inner lead portion shapes are used in the drawings, other shapes may be used that cumulatively cover a substantial majority of a major IC surface. In addition, although a 24-lead package is used to illustrate the invention, the thermally enhanced leadframe structure can be implemented with other lead configurations. Accordingly, it is intended that the invention be limited only in terms of the appended claims.

I claim:

1. A thermally enhanced integrated circuit (IC) package, comprising:

an integrated circuit (IC) having active and non-active surfaces, a plurality of electrically and thermally conductive leads, all of said IC's leads having inner portions that extend along a non-active surface of said IC, wherein at least one of said leads is a ground lead with an inner lead portion that extends along a substantially larger area of said non-active IC surface than any other individual inner lead portion, a thermally conductive adhesive layer between said inner portions of said leads and said non-active IC surface which provides a direct thermal transfer path between said leads and said IC, a plurality of electrical connectors which provide conductive paths between said leads and said active surface, a heat sink attached to a side of said inner lead portions opposite said IC, said inner lead portions being in thermal contact with said heat sink such that heat is efficiently transferred from the IC through said leads to said heat sink, and a moulding compound encapsulating said IC, inner lead portions, and at least a portion of said heat sink.

2. The package of claim 1, wherein said inner lead portions cover at least 80 percent of said non-active IC surface.

3. The package of claim 1, wherein at least some of said inner lead portions include at least one perforation, with said moulding compound extending through said perforation to more securely anchor said inner lead portions to said moulding compound.

4. The package of claim 1, wherein at least some of said inner lead portions include at least one indentation along their perimeters, with said moulding compound extending into said indentations to more securely anchor said inner lead portions to said moulding compound.

5. The package of claim 1, further comprising first and second thermally conductive and electrically insulating adhesive layers between said inner lead portions and said IC and heat sink, respectively, securely holding said IC and said heat sink to said inner lead portions.

6. The package of claim 5, wherein said adhesive layers comprise thermally conductive and electrically insulating tape.

7. The package of claim 1, wherein a major surface of said heat sink is not encapsulated by said moulding compound.

8. The package of claim 1, said heat sink and IC having respective lateral boundaries, said lateral boundaries of said heat sink extending beyond the lateral boundaries of said IC.

9. The package of claim 1, wherein said leads are electrically connected to said IC with wire bonds.

10. A thermally enhanced integrated circuit (IC) package, comprising:

an integrated circuit (IC) having four lateral sides, an active surface and a non-active surface, a plurality of electrically and thermally conductive leads with all of said leads having outer portions arranged along only two opposing sides of said IC package, and respective inner portions that extend along a non-active surface of said IC, the inner portions of said leads being distributed along all four lateral sides of said IC, wherein at least one of said leads is a ground lead that is substantially wider than any other individual inner lead portion, a thermally conductive adhesive layer between said inner portions of said leads and said non-active IC surface which provides a direct thermal transfer path between said leads and said IC, a plurality of electrical connectors which provide conductive paths between said leads and bonding pads on said active surface, a heat sink attached to a side of said inner lead portions opposite said IC such that heat is efficiently transferred from the IC through said leads to said heat sink, and a moulding compound encapsulating said IC, inner lead portions, and at least a portion of said heat sink.

11. The package of claim 10, wherein said inner lead portions cover at least 80 percent of said non-active IC surface.

12. The package of claim 10, wherein at least some of said inner lead portions include at least one perforation outside of said IC, with said moulding compound extending through said perforation to more securely anchor said inner lead portions to said moulding compound.

13. The package of claim 10, wherein at least some of said inner lead portions include at least one indentation along their perimeters, with said moulding compound extending into said indentations to more securely anchor said inner lead portions to said moulding compound.

14. The package of claim 10, further comprising first and second thermally conductive and electrically insulating adhesive layers between said inner lead portions and said IC and heat sink, respectively, securely holding said IC and said heat sink to said inner lead portions.

15. The package of claim 14, wherein said adhesive layers comprise thermally conductive and electrically insulating tape.

16. The package of claim 10, wherein a major surface of said heat sink is not encapsulated by said moulding compound.

17. The package of claim 10, said heat sink and IC having respective lateral boundaries, said lateral boundaries of said heat sink extending beyond the lateral boundaries of said IC.

18. The package of claim 10, wherein said leads are electrically connected to said IC bonding pads with wire bonds.

19. A thermally enhanced integrated circuit (IC) package, comprising:

an integrated circuit (IC) having four lateral sides, an active surface and a non-active surface, a plurality of electrically and thermally conductive leads with all of said leads having outer portions arranged along only two opposing sides of said IC package, and respective inner portions that extend alone a non-active surface of said IC, the inner portions of said leads being distributed along all four lateral sides of said IC, a thermally conductive adhesive layer between said inner portions of said leads and said non-active IC surface which provides a direct thermal transfer path between said leads and said IC, a plurality of electrical connectors which provide conductive paths between said leads and bonding pads on said active surface, a heat sink attached to a side of said inner lead portions opposite said IC such that heat is efficiently transferred from the IC through said leads to said heat sink, and a moulding compound encapsulating said IC, inner lead portions, and at least a portion of said heat sink, said IC having two sides parallel to the opposing sides of said IC package along which the outer lead portions are arranged, and two sides orthogonal to said opposing IC package sides, wherein the leads whose inner lead portions are distributed along the lateral sides of said IC orthogonal to said opposing IC package sides are bent at locations that are at least partially external to said IC and within said moulding compound, and emerge along said two opposing sides of said IC package.

20. The package of claim 19, wherein the angles of said bends fall within the range of 60 to 90 degrees.

* * * * *